United States Patent
Oh

(10) Patent No.: US 10,559,614 B2
(45) Date of Patent: Feb. 11, 2020

(54) DUAL CONVERSION GAIN CIRCUITRY WITH BURIED CHANNELS

(71) Applicant: SEMICONDUCTOR COMPONENTS INDUSTRIES, LLC, Phoenix, AZ (US)

(72) Inventor: Minseok Oh, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 147 days.

(21) Appl. No.: 15/916,947

(22) Filed: Mar. 9, 2018

(65) Prior Publication Data

US 2019/0280031 A1    Sep. 12, 2019

(51) Int. Cl.
*H01L 27/146* (2006.01)
*H01L 27/148* (2006.01)
(Continued)

(52) U.S. Cl.
CPC .... *H01L 27/14616* (2013.01); *H01L 27/1461* (2013.01); *H01L 27/14614* (2013.01);
(Continued)

(58) Field of Classification Search
CPC ......... H01L 27/14616; H01L 27/14614; H01L 27/14612; H01L 27/1461; H01L 27/14609;
(Continued)

(56) References Cited

U.S. PATENT DOCUMENTS 10,110,840 B2 * 10/2018 Velichko ........... H01L 27/14641
2007/0207599 A1   9/2007 Shin
(Continued)

FOREIGN PATENT DOCUMENTS

EP    1887626 A1    2/2008
WO    2013008425 A1    1/2013

OTHER PUBLICATIONS

M. Sakakibara et. el. "An 83dB-Dynamic-Range Single-Exposure Global-Shutter CMOS Image Sensor with In-Pixel Dual Storage", in ISSCC 2012 Proc., pp. 380-382, Feb. 2012.
(Continued)

*Primary Examiner* — John R Lee
(74) *Attorney, Agent, or Firm* — Treyz Law Group, P.C.; Joseph F. Guihan

(57) ABSTRACT

An imaging device may have an array of image sensor pixels each having a photodiode and a floating diffusion node. Each image sensor pixel in the array may also include a dual conversion gain switch and a dual conversion gain capacitor that allows the image sensor pixel to operate in a low conversion gain mode during which the switch is turned on to share charge between the floating diffusion node and the dual conversion gain capacitor, and a high conversion gain mode in which the switch is turned off. During integration, the photodiode may generate more charge than can be held at the floating diffusion node. A buried channel may be provided beneath the dual conversion gain switch to provide a path along which the excess charge can be shared between the floating diffusion node and the dual conversion gain capacitor even when the dual conversion gain switch is off.

20 Claims, 5 Drawing Sheets

(51) Int. Cl.
*H04N 5/359* (2011.01)
*H04N 5/361* (2011.01)
*H04N 5/374* (2011.01)
*H04N 5/3745* (2011.01)
*H04N 5/378* (2011.01)
*H04N 5/355* (2011.01)

(52) U.S. Cl.
CPC .. *H01L 27/14638* (2013.01); *H01L 27/14654* (2013.01); *H01L 27/14806* (2013.01); *H04N 5/3559* (2013.01); *H04N 5/3591* (2013.01); *H04N 5/361* (2013.01); *H04N 5/378* (2013.01); *H04N 5/3741* (2013.01); *H04N 5/37452* (2013.01)

(58) Field of Classification Search
CPC .............. H01L 27/14601; H01L 27/146; H01L 27/14638; H01L 27/14643; H01L 27/14654; H01L 27/14656; H01L 27/14806; H04N 5/359; H04N 5/3591; H04N 5/361; H04N 5/374; H04N 5/3741; H04N 5/3745; H04N 5/37452; H04N 5/3559; H04N 5/378
See application file for complete search history.

(56) References Cited

U.S. PATENT DOCUMENTS

| | | | |
|---|---|---|---|
| 2009/0045319 A1 | 2/2009 | Sugawa | |
| 2009/0140305 A1* | 6/2009 | Sugawa | H01L 27/14603 257/292 |
| 2011/0216231 A1* | 9/2011 | Fowler | H04N 5/335 348/294 |
| 2011/0241080 A1* | 10/2011 | Yamakawa | H01L 27/14614 257/225 |
| 2011/0241089 A1* | 10/2011 | Ohri | H01L 27/14607 257/291 |
| 2011/0248371 A1* | 10/2011 | Matsumura | H01L 27/14612 257/443 |
| 2012/0262616 A1* | 10/2012 | Sa | H04N 5/35527 348/311 |
| 2013/0092982 A1 | 4/2013 | Chen et al. | |
| 2013/0341684 A1* | 12/2013 | Fukuro | H01L 27/14612 257/230 |
| 2014/0049675 A1* | 2/2014 | Takatsuka | H04N 5/3698 348/303 |
| 2014/0077058 A1* | 3/2014 | Sakano | H01L 27/14612 250/208.1 |
| 2014/0192241 A1* | 7/2014 | Koizumi | H04N 5/2355 348/300 |
| 2014/0346572 A1* | 11/2014 | Chen | H01L 27/14806 257/229 |
| 2015/0014750 A1* | 1/2015 | Ohchi | H01L 27/14689 257/225 |
| 2015/0137188 A1* | 5/2015 | Oike | H01L 27/14616 257/225 |
| 2015/0237272 A1* | 8/2015 | Oike | H04N 5/3535 348/296 |
| 2016/0028986 A1* | 1/2016 | Kobayashi | H04N 5/3745 348/307 |
| 2016/0035784 A9* | 2/2016 | Kim | H01L 27/14689 250/208.1 |
| 2016/0064444 A1* | 3/2016 | Inoue | H01L 29/7869 257/43 |
| 2016/0088247 A1* | 3/2016 | Yamashita | H04N 5/378 348/308 |
| 2016/0112662 A1* | 4/2016 | Guillon | H04N 5/3698 348/294 |
| 2016/0126274 A1* | 5/2016 | Kobayashi | H01L 27/14643 257/291 |
| 2016/0134789 A1* | 5/2016 | Inoue | H04N 5/2253 348/374 |
| 2016/0254305 A1* | 9/2016 | Sakano | H01L 27/14609 257/231 |
| 2016/0360138 A1* | 12/2016 | Meynants | H01L 27/14609 |
| 2017/0323912 A1* | 11/2017 | Lahav | H01L 27/14609 |
| 2017/0358617 A1 | 12/2017 | Tekleab et al. | |
| 2018/0247969 A1* | 8/2018 | Mori | H01L 27/14656 |
| 2019/0280031 A1* | 9/2019 | Oh | H01L 27/14614 |

OTHER PUBLICATIONS

N. Akahane, et al., "Optimum Design of Conversion Gain and Full Well Capacity in CMOS Image Sensor With Lateral Overflow Integration Capacitor," IEEE Trans. Electron Devices, vol. 56, No. 11, pp. 2429-2435, Nov. 2009.

* cited by examiner

DUAL CONVERSION GAIN CIRCUITRY WITH BURIED CHANNELS

BACKGROUND

This relates to imaging devices, and more particularly, to image sensor pixels having dual conversion gain functionality.

Image sensors are commonly used in electronic devices such as cellular telephones, cameras, and computers to capture images. In a typical arrangement, an image sensor includes an array of image pixels arranged in pixel rows and pixel columns. Circuitry may be coupled to each pixel column for reading out image signals from the image pixels.

Typical image pixels include a photodiode for generating charge in response to incident light. Image pixels may include a dual conversion gain switch that allows the pixel to operate in a high conversion gain mode in low light conditions in which increased sensitivity is desired, and to operate in a low conversion gain mode in high light conditions in which increased charge storage capacity is desired. In some instances, it may be desirable to use the increased charge storage capacity provided by the dual conversion gain circuitry even when the pixel is being operated in the high conversion gain mode. While the dual conversion gain switch can be turned on to access the increased charge storage capacity of the pixel, this may increase the dark current and noise associated with the pixel.

It would therefore be desirable to be able to provide imaging devices with improved image sensor pixels.

DETAILED DESCRIPTION

Embodiments of the present invention relate to image sensors, and more particularly, to image sensors having pixels with dual conversion gain (DCG) functionality. It will be recognized by one skilled in the art that the present exemplary embodiments may be practiced without some or all of these specific details. In other instances, well known operations have not been described in detail in order to not unnecessarily obscure the present embodiments.

Imaging systems having digital camera modules are widely used in electronic devices such as digital cameras, computers, cellular telephones, and other electronic devices. A digital camera module may include one or more image sensors that gather incoming light to capture an image. Image sensors may include arrays of image pixels. The pixels in the image sensors may include photosensitive elements such as photodiodes that convert the incoming light into electric charge. Image sensors may have any number of pixels (e.g., hundreds or thousands or more). A typical image sensor may, for example, have hundreds, thousands, or millions of pixels (e.g., megapixels). Image sensors may include control circuitry such as circuitry for operating the image pixels and readout circuitry for reading out image signals corresponding to the electric charge generated by the photosensitive elements.

Figure 1:
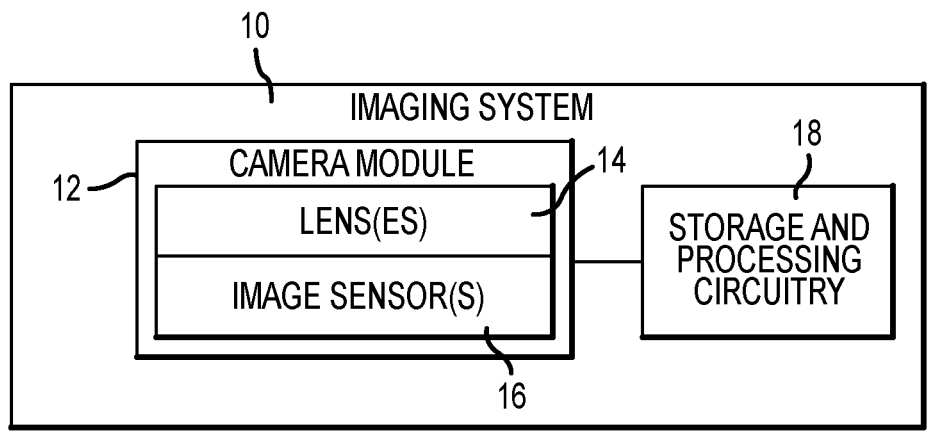
FIG. 1 is a diagram of an illustrative electronic device having an image sensor and processing circuitry for capturing images using an array of image pixels in accordance with an embodiment.

FIG. 1 is a diagram of an illustrative imaging system such as an electronic device that uses an image sensor to capture images. Electronic device 10 of FIG. 1 may be a portable electronic device such as a camera, a cellular telephone, a tablet computer, a webcam, a video camera, a video surveillance system, an automotive imaging system, a video gaming system with imaging capabilities, or any other desired imaging system or device that captures digital image data. Camera module 12 may be used to convert incoming light into digital image data. Camera module 12 may include one or more lenses 14 and one or more corresponding image sensors 16. Lenses 14 may include fixed and/or adjustable lenses and may include microlenses formed on an imaging surface of image sensor 16. During image capture operations, light from a scene may be focused onto image sensor 16 by lenses 14. Image sensor 16 may include circuitry for converting analog pixel data into corresponding digital image data to be provided to storage and processing circuitry 18. If desired, camera module 12 may be provided with an array of lenses 14 and an array of corresponding image sensors 16.

Storage and processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18 (e.g., using an image processing engine on processing circuitry 18, using an imaging mode selection engine on processing circuitry 18, etc.). Processed image data may, if desired, be provided to external equipment (e.g., a computer, external display, or other device) using wired and/or wireless communications paths coupled to processing circuitry 18.

Figure 2:
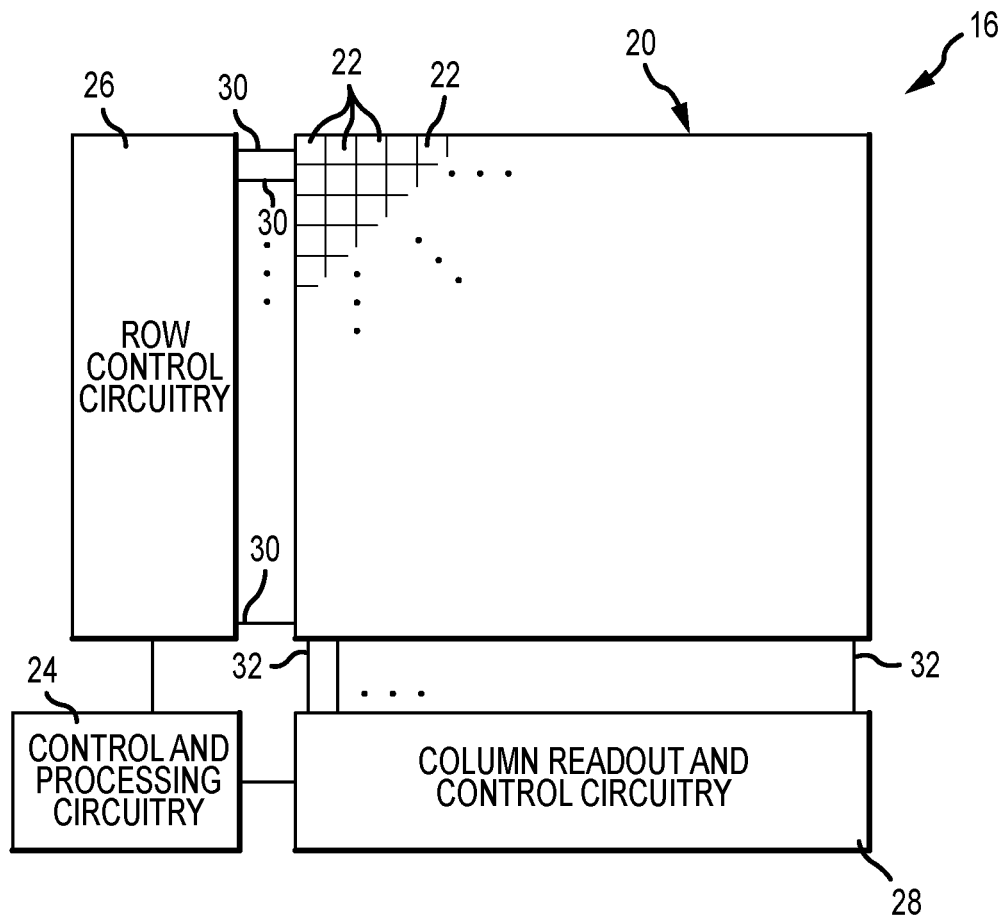
FIG. 2 is a diagram of an illustrative pixel array and associated readout circuitry for reading out image signals from the pixel array in accordance with an embodiment.

As shown in FIG. 2, image sensor 16 may include a pixel array 20 containing image sensor pixels 22 arranged in rows and columns (sometimes referred to herein as image pixels or pixels) and control and processing circuitry 24. Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry). Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 (sometimes referred to as column readout and control circuitry 28) may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

If desired, image pixels 22 may include one or more photosensitive regions for generating charge in response to image light. Photosensitive regions within image pixels 22 may be arranged in rows and columns on array 20. Pixel array 20 may be provided with a color filter array having multiple color filter elements which allows a single image sensor to sample light of different colors. As an example, image sensor pixels such as the image pixels in array 20 may be provided with a color filter array which allows a single image sensor to sample red, green, and blue (RGB) light using corresponding red, green, and blue image sensor pixels arranged in a Bayer mosaic pattern. The Bayer mosaic pattern consists of a repeating unit cell of two-by-two image pixels, with two green image pixels diagonally opposite one another and adjacent to a red image pixel diagonally opposite to a blue image pixel. In another suitable example, the green pixels in a Bayer pattern are replaced by broadband image pixels having broadband color filter elements (e.g., clear color filter elements, yellow color filter elements, etc.). These examples are merely illustrative and, in general, color filter elements of any desired color and in any desired pattern may be formed over any desired number of image pixels 22.

Figure 3:
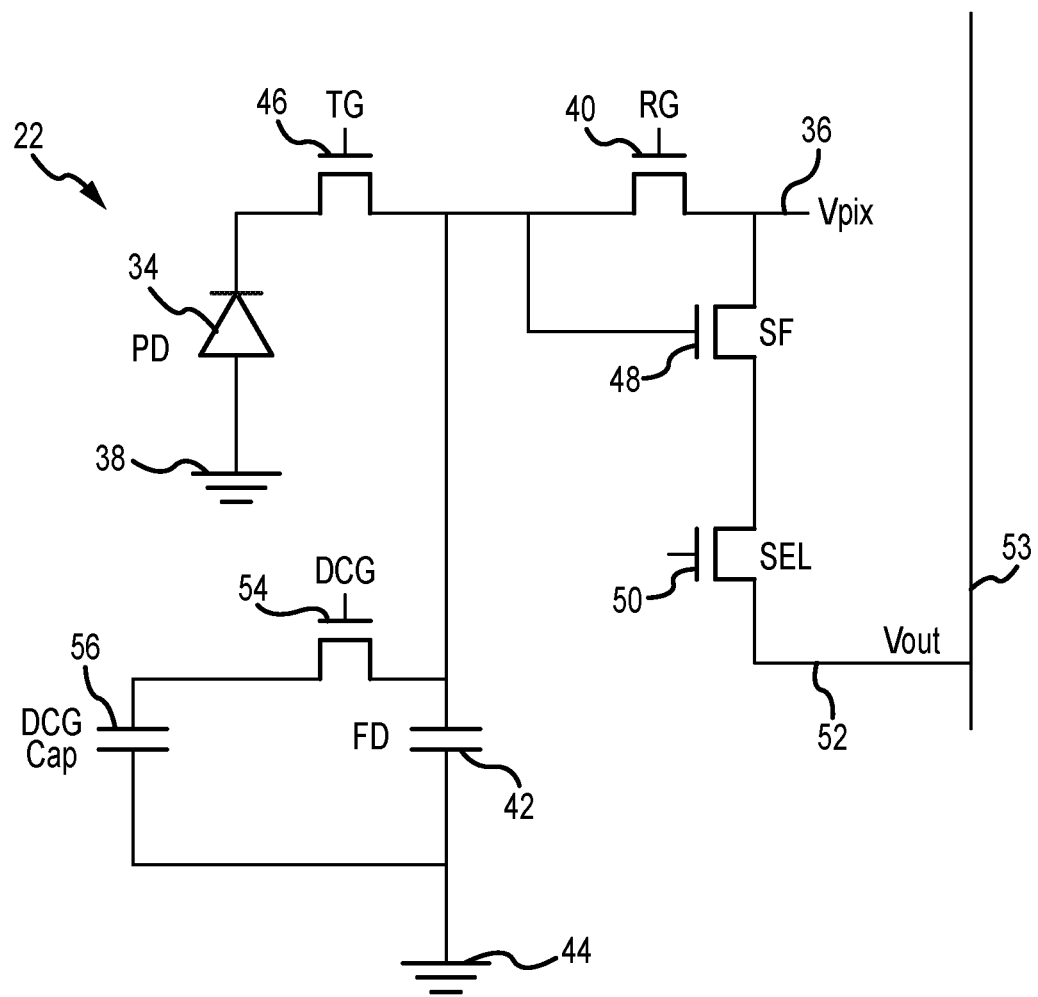
FIG. 3 is a circuit diagram of an illustrative image sensor pixel having dual conversion gain circuitry in accordance with an embodiment.

A circuit diagram of an illustrative image pixel 22 of image pixel array 20 is shown in FIG. 3. As shown in FIG. 3, pixel 22 may include a photosensitive element such as photodiode (PD) 34 (sometimes referred to herein as photodetector 34). A positive pixel power supply voltage (e.g., voltage Vpix) may be supplied at positive power supply terminal 36. A ground power supply voltage may be supplied at ground terminal 38 and ground terminal 44. Photodiode 34 may generate charge (e.g., electrons) in response to receiving impinging photons (i.e., incident light). The amount of charge that is collected by photodiode 34 depends on the intensity of the impinging light and the exposure duration (sometimes referred to herein as an integration period integration time).

Before the integration period begins, reset control signal RG may be asserted. This turns on (sometimes referred to herein as activating) reset transistor 40 and resets charge storage node 42 (also referred to as floating diffusion FD) to a voltage equal or close to Vpix (a reset voltage). During this time, transfer gate 46 may also be turned on and off (transfer signal TG may be asserted and then deasserted) to reset photodiode 34. The reset control signal RG may then be deasserted to turn off (sometimes referred to herein as deactivating) reset transistor 40. After the reset process is complete, the integration period begins and charge begins to accumulate on photodiode 34 in response to incident light. After the integration period has elapsed, transfer gate control signal TG may be asserted to turn on transfer transistor (transfer gate) 46. When transfer transistor 46 is turned on, the charge that has been generated by photodiode 34 in response to the incoming light (i.e., during the integration period) is transferred to charge storage node 42.

Charge storage node 42 may be implemented using a region of doped semiconductor (e.g., a doped silicon region formed in a silicon substrate by ion implantation, impurity diffusion, or other doping techniques). The doped semiconductor region (i.e., the floating diffusion node FD) may exhibit a capacitance that can be used to store the charge that has been transferred from photodiode 34. The signal associated with the stored charge on node 42 is buffered by source-follower (SF) transistor 48. Row select transistor 50 connects the source follower transistor 48 to column output line 53 via path 52.

When it is desired to read out the charge stored on floating diffusion node 42 (i.e., the amount of stored charge that is represented by the signal at the source of transistor 48), row select control signal SEL can be asserted. When signal SEL is asserted, transistor 50 turns on and a corresponding signal Vout that is representative of the magnitude of the charge on charge storage node 42 is produced on output path 52. In a typical configuration, there are numerous rows and columns of pixels such as pixel 22 in the image sensor pixel array 20 of a given image sensor 16. A conductive path such as column readout line 53 can be associated with one column of image pixels 22. The signal Vout on path 52 is coupled onto column readout line 53 for each pixel in array 20 as row select control signal SEL is asserted in each pixel. Column readout line 53 routes signal Vout from the pixel 22 to readout circuitry (e.g., column readout and control circuitry 28 in FIG. 2).

In the arrangement of FIG. 3, pixel 22 is provided with dual conversion gain circuitry including dual conversion gain switch (DCG) 54 (sometimes referred to herein as a dual conversion gain transistor or a dual conversion gain gate) and dual conversion gain capacitor (DCG Cap) 56. Dual conversion gain circuitry allows pixel 22 to operate in a low conversion gain mode and a high conversion gain mode.

When operated in the low conversion gain mode, dual conversion gain switch 54 is turned on. This couples floating diffusion node 42 to dual conversion gain capacitor 56, providing floating diffusion node 42 with additional capacitance. When the charge generated by photodiode 34 and transferred to floating diffusion node 42 is too large to be held at floating diffusion node 42, the excess charge may be stored on capacitor 56, thereby increasing the charge holding capacity of the pixel while decreasing its sensitivity compared to when dual conversion gain switch 54 is off. By leaving dual conversion gain switch 54 on during readout operations (e.g., when row select transistor 50 is turned on), the charge stored on dual conversion gain capacitor 56 may be read out with the charge stored on floating diffusion node 42. By leaving dual conversion gain switch 54 on during reset operations (e.g., when reset transistor 40 is turned on), dual conversion gain capacitor 56 can be reset to a reset voltage equal to or close to Vpix.

When operated in the high conversion gain mode, dual conversion gain switch 54 may be turned off. In this case, charge that is generated by the photodiode 34 is not routed to dual conversion gain capacitor 56, thereby decreasing the charge-holding capacity of the pixel while increasing its sensitivity compared to when dual conversion gain switch 54 is on. In this case, the charge-holding capacity of the pixel is limited to capacitance of the floating diffusion node 42.

In some scenarios, it may be desirable to use the excess charge storage capabilities of dual conversion gain capacitor 56 even when pixel 22 is operating in the high conversion gain mode. For example, if the charge holding capacity of photodiode 34 is exceeded during the integration period (during high illumination conditions, for example), some of the charge may overflow through transfer gate 46 to be held at floating diffusion node 42 (i.e., charge may flow through gate 46 to node 42 even though gate 46 is off). In order to increase the overflow capacity of the pixel 22 in scenarios such as this, it may be desirable to use the excess charge storage capabilities of dual conversion gain capacitor 56 to store the overflow charge.

One way to utilize dual conversion gain capacitor 56 to store overflow charge during integration is to periodically turn on (sometimes referred to herein as pulsing or toggling) dual conversion gain switch 54 during integration, thereby allowing excess charge on floating diffusion node 42 to be shared with (transferred to) dual conversion gain capacitor 56. Toggling dual conversion gain switch in this way, however, may generate additional dark current from floating diffusion node 42. This increased dark current may increase the noise floor of the pixel 22 or increase the fixed pattern noise associated with the pixel 22, potentially decreasing the quality of the images produced.

Figure 4:
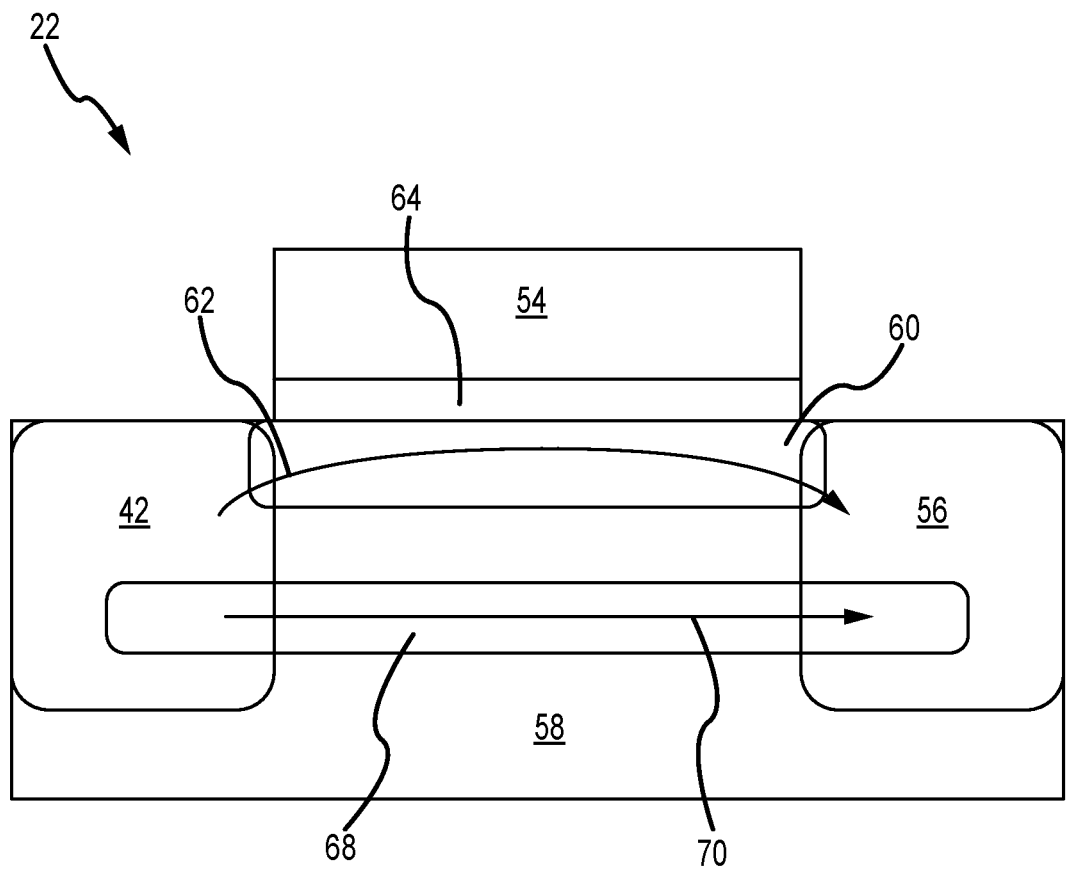
FIG. 4 is a cross-sectional side view of a portion of an illustrative image sensor pixel having a dual conversion gain switch with a buried channel in accordance with an embodiment.

In order to allow dual conversion gain capacitor 56 to store overflow charge during integration without pulsing dual conversion gain switch 54, pixel 22 may be provided with a buried channel beneath switch 54 that creates a path along which charge can move from floating diffusion node 42 to dual conversion gain capacitor 56 without turning dual conversion gain switch 54 on. A cross-sectional side view of a portion of an illustrative image sensor pixel 22 having a dual conversion gain switch 54 with a buried channel is shown in FIG. 4. In the portion of pixel 22 shown in FIG. 4, semiconductor substrate 58 includes a portion of floating diffusion node 42 and a portion of dual conversion gain capacitor 56 formed therein. If desired, the portions of floating diffusion node 42 and dual conversion gain capacitor 56 may be N+-type doped portions (sometimes referred to herein as doped regions) of semiconductor substrate 58. A doped portion 60 (sometimes referred to herein as doped region 60) of semiconductor substrate 58 may extend from floating diffusion node 42 to dual conversion gain capacitor 56, forming an electrical path between node 42 and capacitor 56. As shown in FIG. 4, doped portion 60 may be formed at the surface of semiconductor substrate 58. If desired, doped portion 60 may be a P-type doped portion of semiconductor substrate 58. Dual conversion gain gate 54 is formed over doped portion 60, with gate oxide 64 between gate 54 and doped portion 60.

In addition to doped portion 60, a buried channel 68 may also be formed in semiconductor substrate 58. Buried channel 68 may extend from floating diffusion node 42 to dual conversion gain capacitor 56, forming an electrical path between the node 42 and channel capacitor 56. If desired, buried channel 68 may be an N-type doped portion of semiconductor substrate 58 (sometimes referred to herein as a doped region). As shown in FIG. 4, channel 68 is "buried" in semiconductor substrate 58 (i.e., formed below the surface of semiconductor substrate 58 and/or embedded within semiconductor substrate 58) below doped portion 60.

When dual conversion gain gate 54 is turned on and pixel 22 is operating in the low conversion gain mode, charge will flow from floating diffusion node 42 to dual conversion gain capacitor 56 along path 62 (i.e., through doped portion 60). When dual conversion gain gate 54 is turned off and pixel 22 is operating in high conversion gain mode, however, some charge will still flow from floating diffusion node 42 to dual conversion gain capacitor 56. In this instance, however, the charge will flow along path 70 (i.e., through buried channel 68). In this way, buried channel 68 allows dual conversion gain capacitor 56 to be used for overflow charge storage even when dual conversion gain gate 54 is off and pixel 22 is operating in high conversion gain mode.

Figure 5:
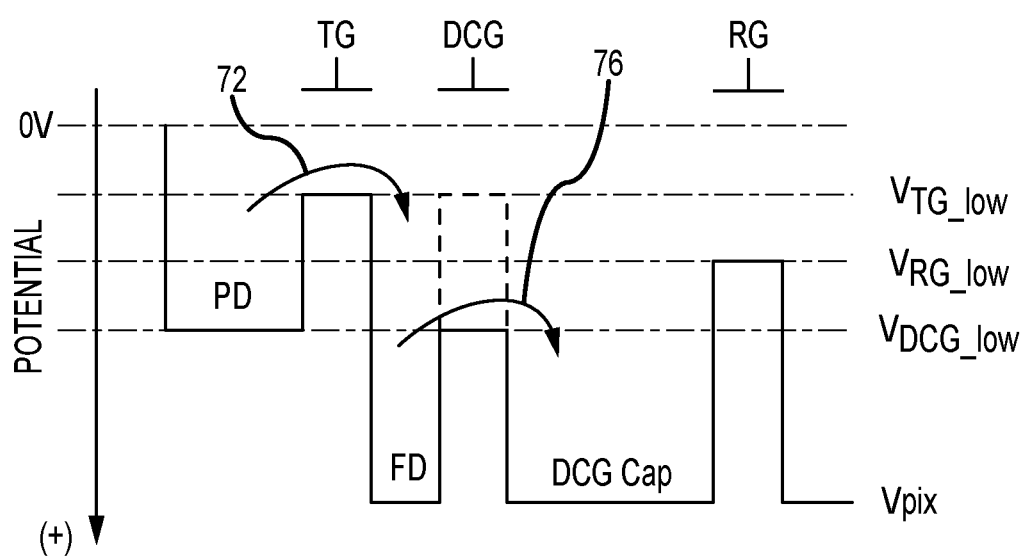
FIG. 5 is a potential diagram of an integration period for an illustrative image sensor pixel having a dual conversion gain switch with a buried channel in accordance with an embodiment.

FIG. 5 shows a potential diagram for an integration period of an illustrative image sensor image pixel 22 of the type described above in connection with FIG. 4. During the integration period, transfer gate 46 may be turned off (transfer gate signal TG may be deasserted such that transfer gate 46 is held at voltage $V_{TG\_low}$). As photodiode 34 (PD) generates electrical charge in response to incident light, the charge holding capacity of photodiode 34 may be exceeded (i.e., the potential of photodiode 34 may reach or drop below $V_{TG\_low}$), causing electrical charge to overflow from photodiode 34 into floating diffusion 42 (FD), as shown by arrow 72.

In the illustrative example of FIG. 5, dual conversion gain switch 54 is off and pixel 22 is operating in high conversion gain mode. In the absence of buried channel 68, the potential barrier between floating diffusion node 42 and dual conversion gain capacitor 56 would be approximately equal to $V_{TG\_low}$ (as shown by the dotted line in FIG. 5). As the overflow charge accumulates on floating diffusion node 42, the charge holding capacity of floating diffusion node 42 may be exceeded (i.e., the potential of floating diffusion node 42 may reach or drop below $V_{TG\_low}$). In this instance, the potential barrier between floating diffusion node 42 and dual conversion gain capacitor 56 is the same as the potential barrier between floating diffusion node 42 and photodiode 34. In order to allow the excess charge to move from floating diffusion node 42 to dual conversion gain capacitor 56, the bias voltage at dual conversion gain switch 54 would have to be increased (i.e., switch 54 would have to be turned on). This, however, may generate dark current and the risk of unwanted additional noise in the image signal.

When buried channel 68 is present, however, the potential barrier between dual conversion gain capacitor 56 and floating diffusion node 42 is decreased to $V_{DCG\_low}$ even when dual conversion gain switch 54 is off. Thus, as the overflow charge accumulates on floating diffusion node 42 such that the charge holding capacity of floating diffusion 42 is exceeded (i.e., the potential of floating diffusion node 42 reaches or drops below $V_{DCG\_low}$), the excess charge may overflow from floating diffusion node 42 to dual conversion gain capacitor 56 as shown by arrow 76. This allows the overflow charge to be integrated without introducing additional dark current and noise associated with pulsing dual conversion gain switch 54.

During the integration period, reset gate 40 is turned off (reset gate signal RG may be deasserted such that reset gate 40 is held at voltage $V_{RG\_low}$). In general, and as shown in FIG. 5, the relationship shown below in equation (1) should be maintained between the relative potentials of transfer gate 46, dual conversion gain switch 54, and reset gate 40 during the integration period:

$$0V < V_{TG\_low} < V_{RG\_low} < V_{DCG\_low} \quad (1)$$

After the integration period has elapsed and the charge on floating diffusion node 42 and dual conversion gain capacitor 56 have been read out, reset gate signal RG may be asserted to reset photodiode 34, floating diffusion node 42, and dual conversion gain capacitor 56 to a voltage at or near Vpix.

Figure 6:
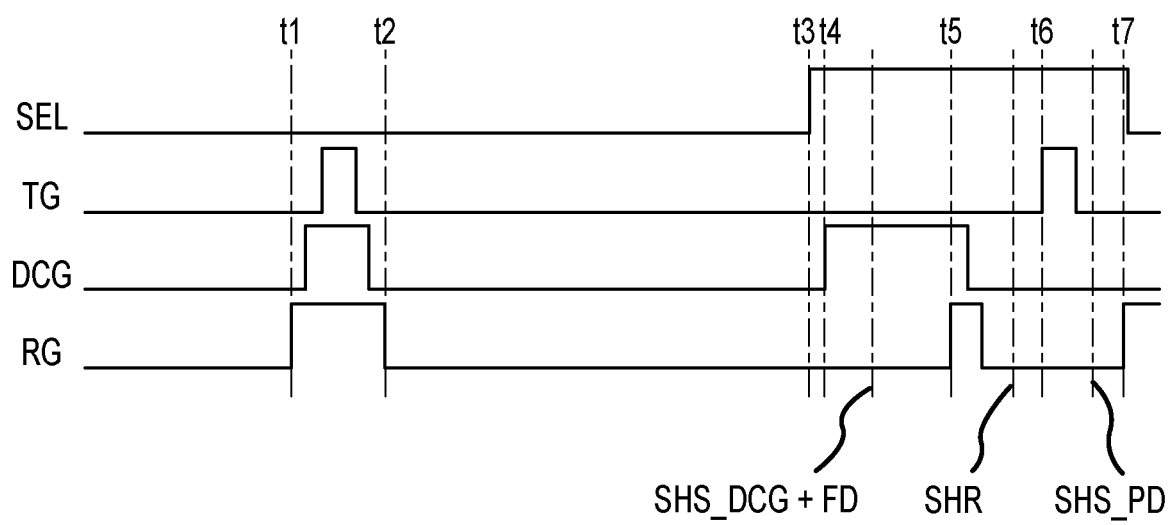
FIG. 6 is a timing diagram for sampling charge from an illustrative image sensor pixel having a dual conversion gain switch with a buried channel in accordance with an embodiment.

A timing diagram for sampling charge from an illustrative image sensor pixel 22 of the type shown and described in connection with FIGS. 3-5 is shown in FIG. 6. At time t1, reset signal RG may be asserted, turning reset transistor 40 on. Reset signal RG may continue to be asserted until time t2. Between time t1 and time t2, dual conversion gain signal DCG may be asserted and transfer gate signal TG may be asserted. This turns on dual conversion gain switch 54 and transfer gate 46, thereby resetting photodiode 34, floating diffusion node 42, and dual conversion gain capacitor 56 to a reset voltage (e.g., Vpix).

At time t2, reset operations end and the integration period begins. During the integration period, photodiodes 34 generate charge in response to incident light. As described above in connection with FIGS. 4 and 5, excess charge that overflows from photodiode 34 during the integration period may be stored on floating diffusion node 42. Due to the presence of buried channel 68, excess charge that overflows from floating diffusion node 42 during the integration period (in high illumination conditions, for example) may be stored on dual conversion gain capacitor 56. As shown in FIG. 6, charge may flow from floating diffusion node 42 to dual conversion gain capacitor 56 without asserting dual conversion gain signal DCG (i.e., without turning on dual conversion gain switch 54) during the integration period.

Near the end of the integration period, image readout circuitry 28, including its sample-and-hold circuitry, may begin to sample the image signals generated by pixel 22. At time t3, row select control signal SEL is asserted, allowing the charge generated by photodiode 34 to be read out. At time t4, dual conversion gain signal DCG is asserted, turning dual conversion gain switch 54 on and ending the integration period (i.e., the integration period lasts from t2 to t4). When the DCG signal is asserted, the overflow charge accumulated at both floating diffusion node 42 and dual conversion gain capacitor 56 during the integration period, (but not the charge generated by photodiode 34 that did not overflow) is coupled onto source-follower transistor 48 and coupled onto column output line 53 via path 52 (read out) as sample signal SHS_DCG+FD (sometimes referred to herein as a first sample signal).

At time t5, and while signal DCG is still asserted, reset signal RG is asserted, resetting floating diffusion node 42 and dual conversion gain capacitor 56 to a reset voltage (e.g., Vpix). Signal DCG is then deasserted, turning off dual conversion gain capacitor 56. After DCG is deasserted, reset signal RG is deasserted. The reset voltage on floating diffusion node 42 is then coupled onto source follower transistor 48 and coupled onto column output line 53 (read out) via path 52 as reset signal SHR.

At time t6, transfer signal TG is asserted, coupling the charge generated by photodiode 34 (that did not overflow) during the integration period onto floating diffusion node 42. Once the charge has been transferred onto floating diffusion 42, transfer signal TG is deasserted. The charge on floating diffusion node 42 is coupled onto source-follower transistor 48 and coupled onto column output line 53 (read out) via path 52 as sample signal SHS_PD (sometimes referred to herein as a second or additional sample signal).

At time t7 row select signal SEL is deasserted, ending readout operations. Reset signal RG is asserted, resetting floating diffusion node 42 to a reset voltage (e.g., Vpix).

After signals SHS_DCG+FD, SHR, and SHS_PD have been sampled, processing circuitry, such as control and processing circuitry 24 of FIG. 2, may be used to generate an image signal indicative of the total amount of charge generated by photodiode 34 (including overflow charge). Reading out both the reset signal SHR and the sample signals SHS_DCG+FD and SHS_PD allows for noise and/or dark current compensation to be performed on the signals (e.g., through subtraction operations). These subtraction operations may be referred to as double sampling. Since reset voltage level (SHR) readout occurs after SHS_DCG+FD sample readout, the double sampling readout for SHS_DCG+FD may be a readout with uncorrelated noise (e.g., the double sampling readout is not a correlated double sampling readout). However, the double sampling readout may still reduce noise levels compared to reading out the signal level alone. Since the reset voltage readout occurs before SHS_PD readout, correlated double sampling may be used to generate a noise and/or dark current-compensated SHS_PD readout signal. After being processed through correlated double sampling operations and/or double sampling operations with uncorrelated noise, signals SHS_DCG+FD and SHS_PD may be combined to generate a noise-corrected signal indicative of the total amount of charge (including overflow charge) generated by photodiode 34 during the integration time.

Although described above in connection with one pixel 22, each pixel 22 in array 20 may be provided with dual conversion gain circuitry (e.g., switch 54 and capacitor 56) having a buried channel 68 that is capable of generating image signals indicative of the total amount of charge generated by photodiode 34 (including overflow charge) with reduced noise. The image signals from each of the pixels 22 in array 20 may then be combined (e.g., by processing circuitry 24) to generate a digital image.

Various embodiments have been described illustrating image sensor pixels having dual conversion gain circuitry with buried channels.

In various embodiments, an image sensor pixel formed on a semiconductor substrate may include a photodetector that generates charge in response to incident light, a floating diffusion node that stores the charge, a dual conversion gain capacitor, a dual conversion gain switch that may transfer the charge from the floating diffusion node to the dual conversion gain capacitor while the dual conversion gain switch is on, and a buried channel in the semiconductor substrate that may transfer the charge from the floating diffusion node to the dual conversion gain capacitor while the dual conversion gain switch is off.

In some embodiments, the photodetector may generate the charge in response to the incident light during an integration period, and the charge stored on the floating diffusion node may overflow from the photodetector to the floating diffusion node during the integration period. During the integration period, the charge stored on the floating diffusion node may overflow from the floating diffusion node to the dual conversion gain capacitor through the buried channel while the dual conversion gain switch is off.

In some embodiments, the floating diffusion node and the dual conversion gain capacitor may include N+-type doped portions of the semiconductor substrate. The buried channel may extend from the floating diffusion node to the dual conversion gain capacitor. The buried channel may include an N-type doped portion of the semiconductor substrate. The charge that is transferred from the floating diffusion node to the dual conversion gain capacitor while the dual conversion gain switch is off may be transferred through the N-type doped portion. The image sensor pixel may further include a P-type doped portion of the semiconductor substrate between the N-type doped portion of the semiconductor substrate and the dual conversion gain switch. The charge that is transferred from the floating diffusion node to the dual conversion gain capacitor while the dual conversion gain switch is on may be transferred through the P-type doped portion.

In various embodiments, an image sensor pixel may include a photodiode that generates charge in response to incident light during an integration time, and a floating diffusion node. The charge generated by the photodiode may overflow from the photodiode to the floating diffusion node during the integration time. The image sensor pixel may further include a dual conversion gain transistor and a dual conversion gain capacitor. Charge may flow from the floating diffusion node to the dual conversion gain capacitor during the integration time without turning on the dual conversion gain transistor.

In some embodiments, the image sensor pixel may be formed in a semiconductor substrate and may further include a buried channel in the semiconductor substrate. During the integration time, charge may flow from the floating diffusion node to the dual conversion gain capacitor through the buried channel, without turning on the dual conversion gain transistor. The image sensor pixel may further include a doped region in the semiconductor substrate through which, during the integration time, the charge may flow from the floating diffusion node to the dual conversion gain capacitor when the dual conversion gain transistor is turned on. The doped region may be between the buried channel and the dual conversion gain transistor. The floating diffusion node and the dual conversion gain capacitor may be formed in the semiconductor substrate. The buried channel may extend from the floating diffusion node to the dual conversion gain capacitor. The doped region may extend from the floating diffusion node to the dual conversion gain capacitor.

In some embodiments, the image sensor pixel may further include a transfer gate coupled between the photodiode and the floating diffusion node. Charge may overflow from the photodiode to the floating diffusion node through the transfer gate. The image sensor pixel may further include a reset gate coupled to the photodiode, the floating diffusion node, and the dual conversion gain capacitor. During the integration time, the dual conversion gain transistor may be held at a first potential, the reset gate may be held at a second potential that is less than the first potential, and the transfer gate may be held at a third potential that is less than the second potential.

In various embodiments, a method of operating an image sensor pixel having a photodiode, a floating diffusion node, a dual conversion gain capacitor, a dual conversion gain switch, and a buried channel beneath the dual conversion gain switch may include generating charge with the photodiode during an integration time. At least some of the charge may overflow from the photodiode during the integration time. The charge that overflows from the photodiode may be stored on the floating diffusion node. At least some of the charge may be transferred from the floating diffusion node to the dual conversion gain capacitor using buried channel without activating the dual conversion gain switch.

In some embodiments, the image sensor further includes a reset gate and a transfer gate that is coupled between the photodetector and the floating diffusion node. The method may further include activating the transfer gate and the dual conversion gain switch, before the integration time begins and while the reset gate is activated, to reset the photodiode, the floating diffusion node, and the dual conversion gain capacitor. The image sensor pixel may further include a row select transistor. The method may further include activating the dual conversion gain switch, after the integration time has ended and while the row select transistor is activated, to read out the charge on the floating diffusion node and the dual conversion gain capacitor as a sample signal. The method may further include activating the reset gate to reset the floating diffusion node and the dual conversion gain capacitor again after reading out the charge on the floating diffusion node and the dual conversion gain capacitor. After resetting the floating diffusion node and the dual conversion gain capacitor again, the dual conversion gain switch may be deactivated. After deactivating the dual conversion gain switch, the charge on the floating diffusion node may be read out as a reset signal. The method may further include activating the transfer gate, after reading out the charge on the floating diffusion node as a reset signal and while the row select transistor is turned on, to transfer, to the floating diffusion node, the charge generated by the photodiode that did not overflow during the integration period. The the charge generated by the photodiode that did not overflow during the integration period may be read out from the floating diffusion node as an additional sample signal.

The foregoing is merely illustrative and various modifications can be made to the described embodiments. The foregoing embodiments may be implemented individually or in any combination.

What is claimed is:

1. An image sensor pixel formed on a semiconductor substrate, the image sensor pixel comprising:
   a photodetector that generates charge in response to incident light;
   a floating diffusion node that stores the charge;
   a dual conversion gain capacitor;
   a dual conversion gain switch that transfers the charge from the floating diffusion node to the dual conversion gain capacitor while the dual conversion gain switch is on; and
   a buried channel in the semiconductor substrate that transfers the charge from the floating diffusion node to the dual conversion gain capacitor while the dual conversion gain switch is off.

2. The image sensor pixel defined in claim 1 wherein the photodetector generates the charge in response to the incident light during an integration period, and wherein charge stored on the floating diffusion node overflows from the photodetector to the floating diffusion node during the integration period.

3. The image sensor pixel defined in claim 2 wherein, during the integration period, the charge stored on the floating diffusion node overflows from the floating diffusion node to the dual conversion gain capacitor through the buried channel while the dual conversion gain switch is off.

4. The image sensor pixel defined in claim 1 wherein the floating diffusion node and the dual conversion gain capacitor comprise N+-type doped portions of the semiconductor substrate.

5. The image sensor pixel defined in claim 4 wherein the buried channel extends from the floating diffusion node to the dual conversion gain capacitor.

6. The image sensor pixel defined in claim 5 wherein the buried channel comprises an N-type doped portion of the semiconductor substrate and wherein the charge that is transferred from the floating diffusion node to the dual conversion gain capacitor while the dual conversion gain switch is off is transferred through the N-type doped portion.

7. The image sensor pixel defined in claim 6 further comprising:
   a P-type doped portion of the semiconductor substrate interposed between the N-type doped portion of the semiconductor substrate and the dual conversion gain switch, wherein the charge that is transferred from the floating diffusion node to the dual conversion gain capacitor while the dual conversion gain switch is on is transferred through the P-type doped portion.

8. An image sensor pixel comprising:
   a photodiode that generates charge in response to incident light during an integration time;
   a floating diffusion node, wherein the charge overflows from the photodiode to the floating diffusion node during the integration time;
   a dual conversion gain transistor coupled to the floating diffusion node; and
   a dual conversion gain capacitor, wherein the dual conversion gain transistor is interposed between the floating diffusion node and the dual conversion gain capacitor and wherein the charge flows from the floating diffusion node to the dual conversion gain capacitor during the integration time without turning on the dual conversion gain transistor.

9. The image sensor pixel defined in claim 8 wherein the image sensor pixel is formed in a semiconductor substrate, the image sensor pixel further comprising:
   a buried channel in the semiconductor substrate through which, during the integration time, the charge flows from the floating diffusion node to the dual conversion gain capacitor without turning on the dual conversion gain transistor.

10. The image sensor pixel defined in claim 9 further comprising:
    a doped region in the semiconductor substrate through which, during the integration time, the charge flows from the floating diffusion node to the dual conversion gain capacitor when the dual conversion gain transistor is turned on, wherein the doped region is interposed between the buried channel and the dual conversion gain transistor.

11. The image sensor pixel defined in claim 10 wherein floating diffusion node and the dual conversion gain capacitor are formed in the semiconductor substrate.

12. The image sensor pixel defined in claim 11 wherein the buried channel extends from the floating diffusion node to the dual conversion gain capacitor.

13. The image sensor pixel defined in claim 12 wherein the doped region extends from the floating diffusion node to the dual conversion gain capacitor.

14. The image sensor pixel defined in claim 8 further comprising:
    a transfer gate coupled between the photodiode and the floating diffusion node, wherein the charge overflows from the photodiode to the floating diffusion node through the transfer gate; and
    a reset gate coupled to the photodiode, the floating diffusion node, and the dual conversion gain capacitor.

15. The image sensor pixel defined in claim 14 wherein during the integration time, the dual conversion gain transistor is held at a first potential, the reset gate is held at a second potential that is less than the first potential, and the transfer gate is held at a third potential that is less than the second potential.

16. A method of operating an image sensor pixel having a photodiode, a floating diffusion node coupled to the photodiode, a dual conversion gain capacitor, a dual conversion gain switch that is coupled between the floating diffusion node and the dual conversion capacitor, and a buried channel beneath the dual conversion gain switch, the method comprising:
    with the photodiode, generating charge during an integration time, wherein at least some of the charge overflows from the photodiode during the integration time;
    with the floating diffusion node, storing the charge that overflows from the photodiode; and
    with the buried channel, transferring at least some of the charge from the floating diffusion node to the dual conversion gain capacitor without activating the dual conversion gain switch.

17. The method defined in claim 16 wherein the image sensor further comprises a reset gate and a transfer gate that is coupled between the photodiode and the floating diffusion node, the method further comprising:
    before the integration time begins, activating the transfer gate and the dual conversion gain switch while the reset gate is activated to reset the photodiode, the floating diffusion node, and the dual conversion gain capacitor.

18. The method defined in claim 17 wherein the image sensor further comprises a row select transistor, the method further comprising:
    after the integration time has ended, activating the dual conversion gain switch while the row select transistor is activated to read out the charge on the floating diffusion node and the dual conversion gain capacitor as a sample signal;
    after reading out the charge on the floating diffusion node and the dual conversion gain capacitor, activating the reset gate to reset the floating diffusion node and the dual conversion gain capacitor again;
    after resetting the floating diffusion node and the dual conversion gain capacitor again, deactivating the dual conversion gain switch;
    after deactivating the dual conversion gain switch, reading out the charge on the floating diffusion node as a reset signal;
    after reading out the charge on the floating diffusion node as a reset signal, activating the transfer gate while the row select transistor is turned on to transfer, to the floating diffusion node, the charge generated by the photodiode that did not overflow during the integration period; and
    reading out, from the floating diffusion node, the charge generated by the photodiode that did not overflow during the integration period as an additional sample signal.

19. The image sensor pixel defined in claim 1, wherein the floating diffusion node is coupled to the photodetector and wherein the dual conversion gain switch is coupled between the floating diffusion node and the dual conversion gain capacitor.

20. The image sensor pixel defined in claim 8, wherein the floating diffusion node is coupled to the photodiode.

* * * * *